(12) United States Patent
Chang et al.

(10) Patent No.: US 12,074,031 B2
(45) Date of Patent: Aug. 27, 2024

(54) METHOD OF FABRICATING SEMICONDUCTOR DEVICE

(71) Applicant: Samsung Electronics Co., Ltd., Suwon-si (KR)

(72) Inventors: Chong Kwang Chang, Hwaseong-si (KR); Dong Hoon Khang, Hwaseong-si (KR); Sug Hyun Sung, Yongin-si (KR); Min Hwan Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 202 days.

(21) Appl. No.: 17/303,062

(22) Filed: May 19, 2021

(65) Prior Publication Data

US 2021/0272815 A1  Sep. 2, 2021

Related U.S. Application Data

(63) Continuation of application No. 16/540,726, filed on Aug. 14, 2019, now Pat. No. 11,024,509.

(30) Foreign Application Priority Data

Jan. 18, 2019 (KR) .................. 10-2019-0006773

(51) Int. Cl.
*H01L 21/308* (2006.01)
*H01L 21/8234* (2006.01)
*H01L 29/66* (2006.01)

(52) U.S. Cl.
CPC .. *H01L 21/3086* (2013.01); *H01L 21/823431* (2013.01); *H01L 21/823468* (2013.01); *H01L 29/6681* (2013.01)

(58) Field of Classification Search
CPC ......... H01L 21/3086; H01L 21/823431; H01L 29/6681; H01L 21/823481
See application file for complete search history.

(56) References Cited

U.S. PATENT DOCUMENTS

| | | | |
|---|---|---|---|
| 7,503,026 B2 | 3/2009 | Ichiryu et al. |
| 8,788,998 B2 | 7/2014 | Hatamian et al. |
| 8,863,063 B2 | 10/2014 | Becker et al. |
| 9,105,467 B2 | 8/2015 | Lee et al. |
| 9,147,028 B2 | 9/2015 | Rashed et al. |
| 9,236,269 B2 | 1/2016 | Kozarsky et al. |
| 9,576,978 B2 | 2/2017 | Baek et al. |

(Continued)

FOREIGN PATENT DOCUMENTS

| | | |
|---|---|---|
| KR | 1020090114251 A | 11/2009 |
| KR | 1020160123127 A | 10/2016 |
| KR | 1020180015099 A | 2/2018 |

*Primary Examiner* — Michele Fan
(74) *Attorney, Agent, or Firm* — Myers Bigel, P.A.

(57) ABSTRACT

A method of fabricating a semiconductor device is provided. The method includes: forming mask patterns on a substrate, the mask patterns including a first mask fin pattern, a second mask fin pattern and a dummy mask pattern between the first mask fin pattern and the second mask fin pattern; forming a first fin pattern, a second fin pattern and a dummy fin pattern by etching the substrate using the mask patterns; and removing the dummy fin pattern, wherein the dummy mask pattern is wider than each of the first mask fin pattern and the second mask fin pattern.

14 Claims, 17 Drawing Sheets

(56) References Cited

U.S. PATENT DOCUMENTS

| | | |
|---|---|---|
| 9,634,001 B2 | 4/2017 | Wann et al. |
| 9,691,775 B1 | 6/2017 | Licausi et al. |
| 9,786,788 B1 | 10/2017 | Anderson et al. |
| 9,899,393 B2 | 2/2018 | Chung |
| 2003/0082888 A1* | 5/2003 | Lin .................. H01L 21/76229 257/E21.549 |
| 2013/0217233 A1 | 8/2013 | Chang et al. |
| 2014/0264717 A1 | 9/2014 | Shieh et al. |
| 2016/0181243 A1* | 6/2016 | Youn ............... H01L 21/823431 257/401 |
| 2016/0307802 A1* | 10/2016 | Lee .................... H01L 27/1104 |
| 2016/0307803 A1* | 10/2016 | Mun .................. H01L 21/3086 |
| 2017/0278870 A1 | 9/2017 | Cheng |
| 2017/0316951 A1 | 11/2017 | Cheng |
| 2019/0035785 A1 | 1/2019 | Ching et al. |

\* cited by examiner

METHOD OF FABRICATING SEMICONDUCTOR DEVICE

CROSS-REFERENCE TO RELATED APPLICATION

This application is a continuation of U.S. patent application Ser. No. 16/540,726; filed Aug. 14, 2019, which claims priority under 35 U.S.C. § 119 to Korean Patent Application No. 10-2019-0006773, filed Jan. 18, 2019, in the Korean Intellectual Property Office, the disclosure of which is incorporated herein by reference in its entirety.

BACKGROUND

1. Field

The present disclosure relates to methods of fabricating a semiconductor device.

2. Description of the Related Art

With the rapid spread of information media, the functionality of semiconductor devices is dramatically evolving. To secure competitiveness, semiconductor products may be required to become highly integrated for low cost and high quality. For high integration, semiconductor devices are being scaled down.

As the integration density of semiconductor devices increases, design rules for elements of the semiconductor devices are being reduced. When a semiconductor device having fine patterns is fabricated in line with a trend toward high integration, it may be necessary to implement patterns having a fine line width exceeding the resolution limit of photolithography equipment.

In addition, as semiconductor devices become highly integrated, a gap between an active region where a source/drain contact is formed and a gate contact is reduced, thereby increasing the possibility of an electrical short circuit between an element disposed in the active region and the gate contact.

SUMMARY

According to some embodiments of the inventive concept, there is provided a method of a semiconductor device comprising: forming mask patterns on a substrate, the mask patterns comprising a first mask fin pattern, a second mask fin pattern and a dummy mask pattern between the first mask fin pattern and the second mask fin pattern: forming a first fin pattern, a second fin pattern and a dummy fin pattern by etching the substrate using the mask patterns: and removing the dummy fin pattern, wherein the dummy mask pattern is wider than each of the first mask fin pattern and the second mask fin pattern.

According to other embodiments of the inventive concept, there is provided a method of fabricating a semiconductor device comprising: forming a lower mask layer and an upper mask layer which are sequentially stacked on a substrate: forming a first upper mask fin pattern and a second upper mask fin pattern, which are spaced apart from each other, by etching the upper mask layer: forming a sacrificial layer, which is on the first upper mask fin pattern and the second upper mask fin pattern and on the lower mask layer: forming a photosensitive film pattern on the sacrificial layer between the first upper mask fin pattern and the second upper mask fin pattern: forming lower mask fin patterns on the substrate by etching the lower mask layer using the photosensitive film pattern, the first upper mask fin pattern and the second upper mask fin pattern: and forming fin patterns by etching the substrate using the lower mask fin patterns.

According to further embodiments of the inventive concept, there is provided a method of fabricating a semiconductor device comprising: forming a lower mask layer, an upper mask layer, a first sacrificial layer and a second sacrificial layer which are sequentially stacked on a substrate: forming a first photosensitive film pattern on the second sacrificial layer: forming a first mandrel by etching the second sacrificial layer using the first photosensitive film pattern: forming first spacers on sidewalls of the first mandrel: forming a second mandrel by etching the first sacrificial layer using the first spacers: forming second spacers on sidewalls of the second mandrel: forming a first upper mask fin pattern and a second upper mask fin pattern, which are spaced apart from each other, by etching the upper mask layer using the second spacers: forming a third sacrificial layer, which is on the first upper mask fin pattern and the second upper mask fin pattern and on the lower mask layer: forming a second photosensitive film pattern on the third sacrificial layer between the first upper mask fin pattern and the second upper mask fin pattern: forming lower mask fin patterns on the substrate by etching the lower mask layer using the second photosensitive film pattern, the first upper mask fin pattern and the second upper mask fin pattern: and forming fin patterns by etching the substrate using the lower mask fin patterns.

Embodiments of the present inventive concept are not restricted to the ones set forth above. The above and other embodiments of the present inventive concept will become more apparent to one of ordinary skill in the art to which the present disclosure pertains by referencing the detailed description of the present inventive concept given below.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

The inventive concept will now be described more fully with reference to the accompanying drawings, in which example embodiments of the inventive concept are shown. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Aspects of the present disclosure may provide method of fabricating a semiconductor device that may prevent or reduce the likelihood of a short circuit between an element in an active region and a gate contact in the semiconductor device.

Aspects of the present disclosure may also provide a method of fabricating a semiconductor device that may reduce or minimize an increase in cell area and an increase the width of a shallow trench isolation (STI) region.

Aspects of the present disclosure may also provide a method of fabricating a semiconductor device in which the number of fins formed in an active region may be maintained while increasing the width of an STI region.

Aspects of the present disclosure also provide a method of fabricating a semiconductor device, the method being employed to prevent a loading effect that occurs in the process of forming fins.

A method of fabricating a semiconductor device according to some embodiments of the inventive concept will now be described with reference to FIGS. 1 through 15. FIGS. 1 through 13 are views illustrating a method of fabricating a semiconductor device according to some embodiments of the inventive concept. In the method of fabricating a semiconductor device according to some embodiments of the inventive concept, fin patterns 110, 111 and 115 may be formed using quadruple patterning technology (QPT).

Figure 1:
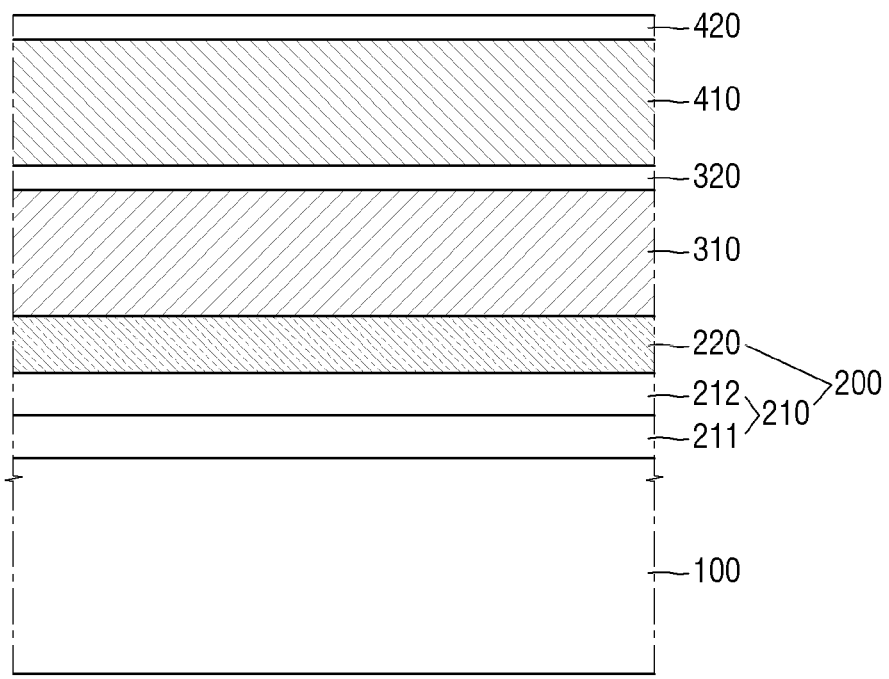
FIGS. 1 through 13 are views illustrating a method of fabricating a semiconductor device according to some embodiments of the inventive concept.

Referring to FIG. 1, a mask layer 200 may be formed on a substrate 100.

The substrate 100 may be, for example, a silicon substrate, a bulk silicon substrate or a silicon-on-insulator (SOI) substrate. Otherwise, the substrate 100 may include an elemental semiconductor, such as germanium, or a compound semiconductor, such as a group IV-IV compound semiconductor or a group III-V compound semiconductor. Alternatively, the substrate 100 may include a base substrate and an epitaxial layer formed on the base substrate.

The group IV-IV compound semiconductor may be, for example, a binary or ternary compound including two or more of carbon (C), silicon (Si), germanium (Ge) and tin (Sn) or a compound obtained by doping the binary or ternary compound with a group IV element.

The group III-V compound semiconductor may be, for example, a binary, ternary, or quaternary compound composed of aluminum (Al), gallium (Ga) and/or indium (In) (i.e., group III elements) bonded with phosphorus (P), arsenic (As), and/or antimony (Sb) (i.e., group V elements) or combinations thereof.

The mask layer 200 may include a lower mask layer 210 and an upper mask layer 220 stacked sequentially on the substrate 100. The lower mask layer 210 may include a first lower mask layer 211 and a second lower mask layer 212.

Each of the first lower mask layer 211, the second lower mask layer 212, and the upper mask layer 220 may include a silicon-containing material, such as silicon oxide (SiOx), silicon oxynitride (SiON), silicon nitride (SixNy), tetraethyl orthosilicate (TEOS) and/or polycrystalline silicon, a carbon-containing material, such as an amorphous carbon layer (ACL) and/or a spin-on-hard mask (SOH), and a metal.

For example, the first lower mask layer 211 may include silicon nitride and may further include a thin silicon oxide layer under the silicon nitride. The second lower mask layer 212 may include silicon oxide, and the upper mask layer 220 may include poly crystalline silicon.

Each of the first lower mask layer 211, the second lower mask layer 212, and the upper mask layer 220 may be formed by a process, such as atomic layer deposition (ALD), chemical vapor deposition (CVD), or spin coating. A bake process or a curing process may be performed based on the material.

A first sacrificial layer 310 and a first capping layer 320 may be sequentially formed on the mask layer 200.

The first sacrificial layer 310 may include polycrystalline silicon, an ACL, and/or an SOH.

The first sacrificial layer 310 may be a layer for forming mandrels in a subsequent process. Thus, the first sacrificial layer 310 may include a material having an etch selectivity with respect to the upper mask layer 220. For example, because the upper mask layer 220 may include polycrystalline silicon, the first sacrificial layer 310 may include one of polycrystalline, an ACL, and an SOH.

The first capping layer 320 may include, for example, silicon oxynitride (SiON).

Each of the first sacrificial layer 310 and the first capping layer 320 may be formed by a process, such as ALD, CVD, or spin coating. A bake process or a curing process may be additionally performed based on the material.

A second sacrificial layer 410 and a second capping layer 420 may be sequentially formed on the first capping layer 320.

The second sacrificial layer 410 may include polycrystalline silicon, an ACL, and/or an SOH.

The second capping layer 420 may include, for example, silicon oxynitride (SiON).

Each of the second sacrificial layer 410 and the second capping layer 420 may be formed by a process, such as ALD, CVD, and/or spin coating. A bake process or a curing process may be additionally performed based on the material.

Figure 2:
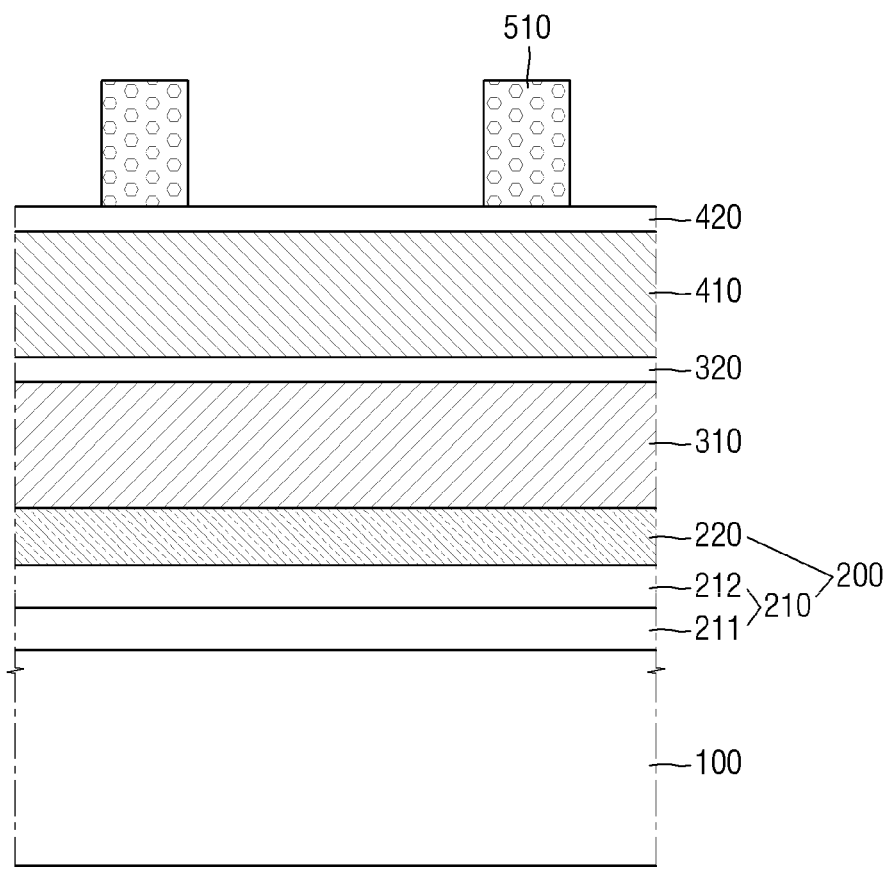

Referring to FIG. 2, first photosensitive film patterns 510 may be formed on the second capping layer 420.

The first photosensitive film patterns 510 may be formed by forming a photoresist (PR) on the second capping layer 420 and then performing a photolithography process. In FIG. 2, each of the first photosensitive film patterns 510 is illustrated as a single layer. However, this is merely for purposes of description, and the first photosensitive film patterns 510 may include multiple layers in other embodiments of the inventive concept.

In some embodiments, each of the first photosensitive film patterns 510 may include an anti-reflective layer for inhibiting or preventing light from being reflected by an underlying film during a photolithography process. The anti-reflective layer may include, but is not limited to, a bottom anti-reflective coating (BARC) and/or a developable bottom anti-reflective coating (dBARC).

Although two first photosensitive film patterns 510 are illustrated for purposes of description, three or more first photosensitive film patterns 510 can also be formed in accordance with various embodiments of the inventive concept.

Figure 3:
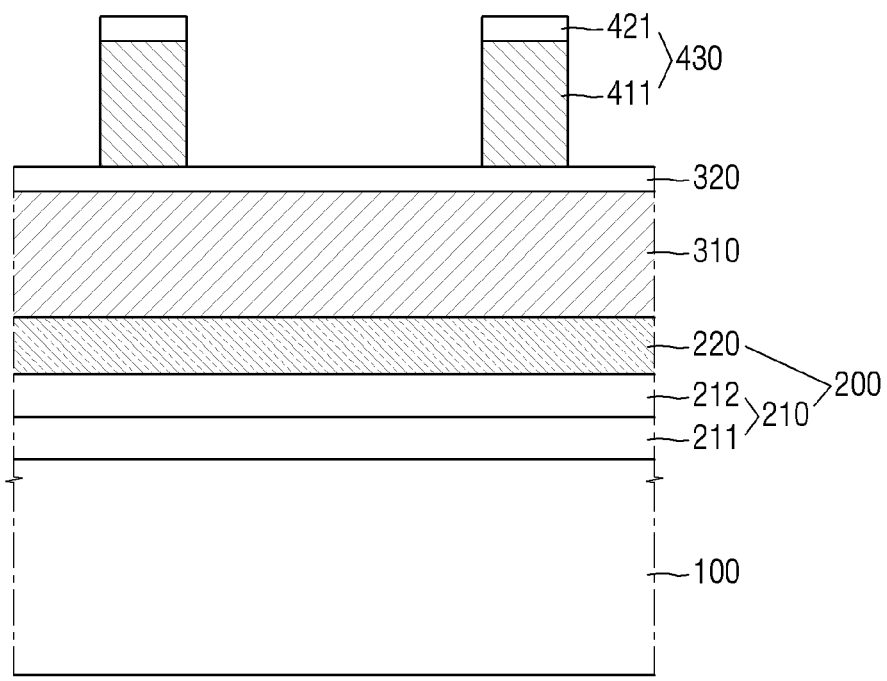

Referring to FIG. 3, the second capping layer 420 and the second sacrificial layer 410 may be patterned using the first photosensitive film patterns 510 as an etch mask.

The etching of the second capping layer 420 and the second sacrificial layer 410 may result in the formation of first mandrels 430. Each of the first mandrels 430 formed on the first sacrificial layer 310 and the first capping layer 320 may include a first portion 411 of the second sacrificial layer 410 and a first portion 421 of the second capping layer 420.

Figure 4:
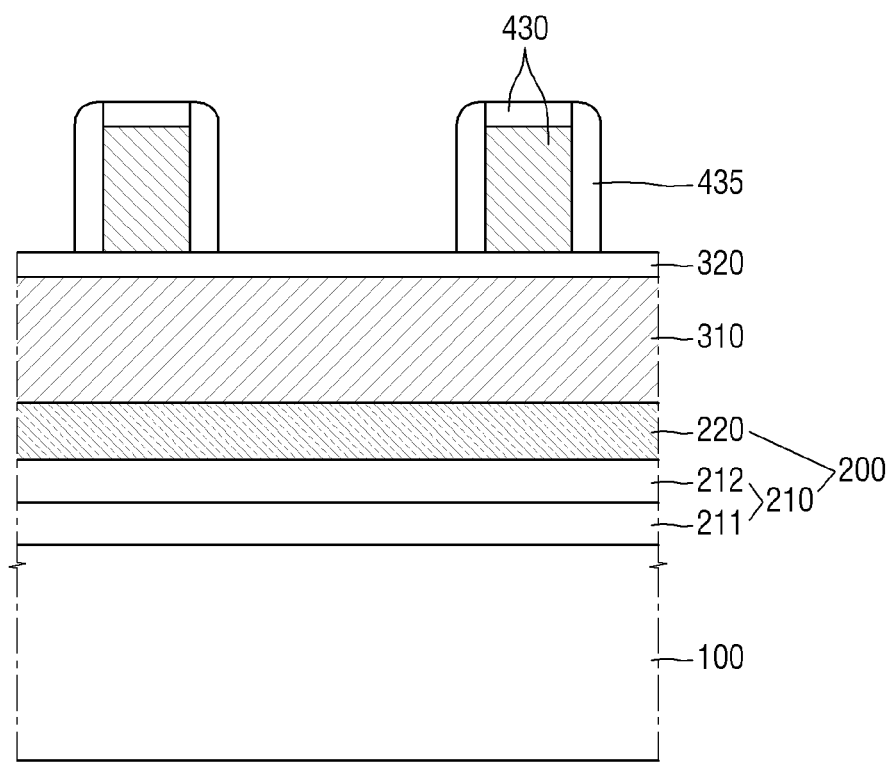

Referring to FIG. 4, first spacers 435 may be formed on sidewalls of the first mandrels 430. That is, the first spacers 435 may be formed on the first capping layer 320.

Specifically, a first spacer material layer is formed to conformally cover the first mandrels 430. Then, an etchback process is performed to form the first spacers 435 on the sidewalls of the first mandrels 430 by removing the first spacer material layer from a top surface, opposite the first capping layer 320, of each of the first mandrels 430.

The thickness of the first spacer material layer may be determined based on a gap between a plurality of first fin patterns 110 (see FIG. 13) to be formed in the final device and a gap between a plurality of second fin patterns 111 (see FIG. 13) to be formed in the final device. The gap between the first fin patterns 110 to be formed in the final device and the gap between the second fin patterns 111 to be formed in the final device may be narrower than the resolution limit of commercialized photolithography equipment.

The first spacer material layer may include a material having an etch selectivity with respect to the first mandrels 430. For example, when the first mandrels 430 include polycrystalline silicon, an ACL, and/or an SOH, the first spacer material layer may include silicon oxide or silicon nitride. The first spacer material layer may be formed by, for example, ALD.

In the method of fabricating a semiconductor device according to some embodiments of the inventive concept, the first spacers 435 may include silicon oxide.

Figure 5:
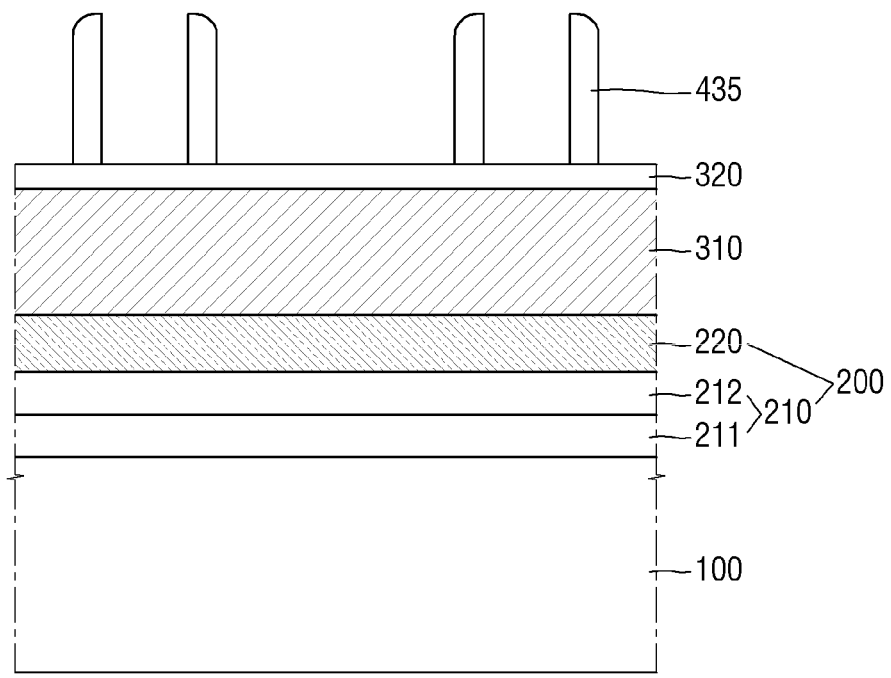

Referring to FIG. 5, the first mandrels 430 may be removed.

Because only the first mandrels 430 are removed, the first spacers 435 may remain on the first capping layer 320.

Because two first photosensitive film patterns 510 are illustrated as an example, four first spacers 435 are formed. However, embodiments of the present inventive concept are not limited to any particular number of first spacers 435. When three or more first photosensitive film patterns 510 are used, six or more first spacers 435 may be formed. For example, when four first sensitive film patterns 510 are used, eighth first spacers 435 may be formed. For another example, when six first photosensitive film patterns 510 are used, twelve first spacers 435 may be formed.

Figure 6:
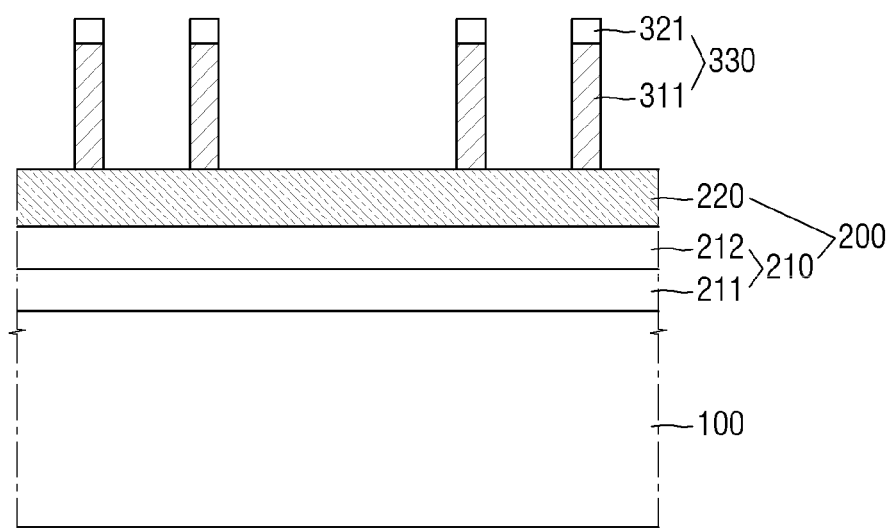

Referring to FIG. 6, the first capping layer 320 and the first sacrificial layer 310 may be patterned using the first spacers 435 as an etch mask.

The etching of the first capping layer 320 and the first sacrificial layer 310 may result in the formation of second mandrels 330. Each of the second mandrels 330 formed on the upper mask layer 220 may include a first portion 311 of the first sacrificial layer 310 and a first portion 321 of the first capping layer 320.

Figure 7:
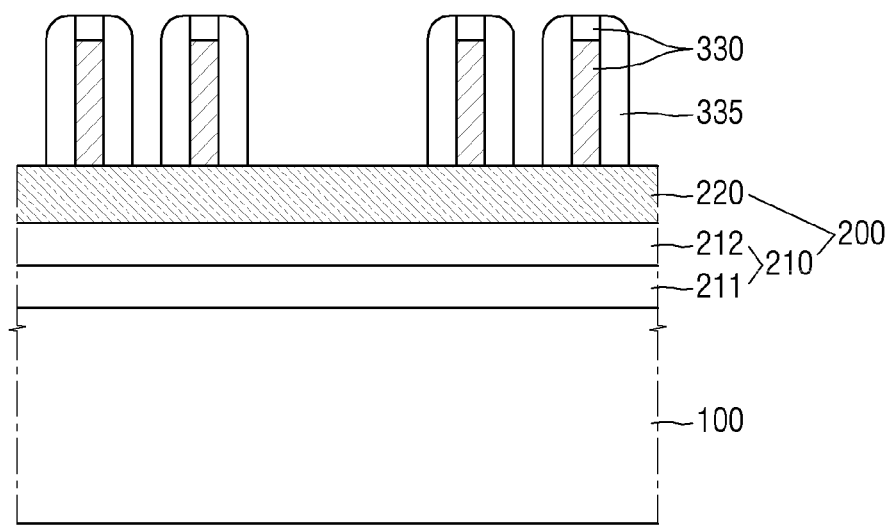

Referring to FIG. 7, second spacers 335 may be formed on sidewalls of the second mandrels 330. That is, the second spacers 335 may be formed on the upper mask layer 220.

Specifically, a second spacer material layer is formed to conformally cover the second mandrels 330. Then, an etchback process is performed to form the second spacers 335 on the sidewalls of the second mandrels 330 by removing the second spacer material layer from a top surface, opposite the upper mask layer 220, of each of the mandrels 330.

The thickness of the second spacer material layer may be determined based on the gap between the first fin patterns 110 (see FIG. 13) to be formed in the final device and the gap between the second fin patterns 111 (see FIG. 13) to be formed in the final device. The gap between the first fin patterns 110 to be formed in the final device and the gap between the second fin patterns 111 to be formed in the final device may be narrower than the resolution limit of commercialized photolithography equipment.

The second spacer material layer may include a material having an etch selectivity with respect to the second mandrels 330. For example, when the second mandrels 330 include polycrystalline silicon, an ACL, and/or an SOH, the second spacer material layer may include silicon oxide or silicon nitride. The second spacer material layer may be formed by, for example, ALD.

In the method of fabricating a semiconductor device according to some embodiments of the inventive concept, the second spacers 335 may include silicon oxide.

Figure 8:
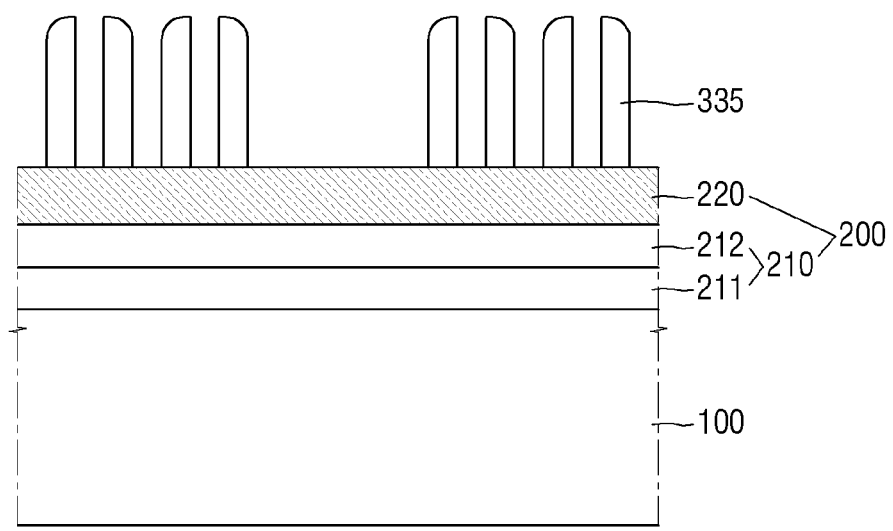

Referring to FIG. 8, the second mandrels 330 may be removed.

Because only the second mandrels 330 are removed, the second spacers 335 may remain on the upper mask layer 220.

Figure 9:
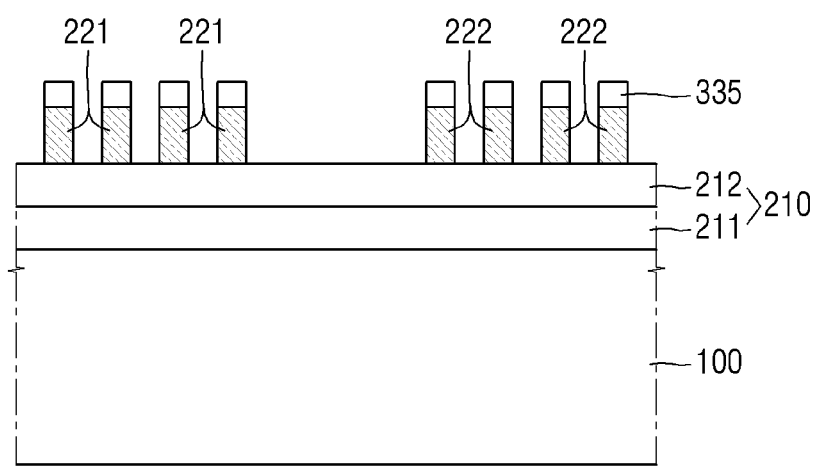

Referring to FIG. 9, the upper mask layer 220 may be patterned using the second spacers 335 as an etch mask.

The etching of the upper mask layer 220 may result in the formation of upper mask fin patterns 221 and 222. The upper mask fin patterns 221 and 222 may be formed to correspond to the second spacers 335.

Figure 10:
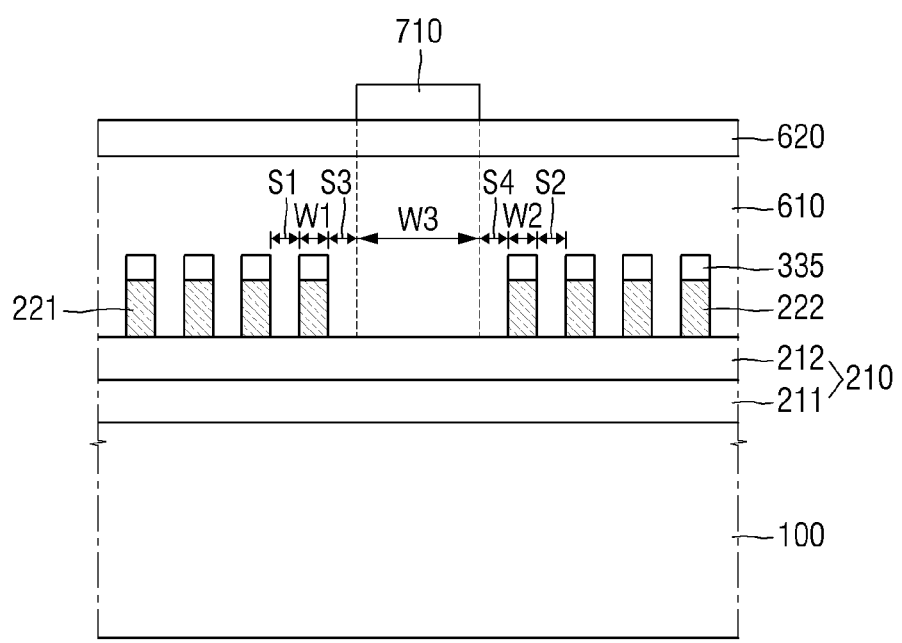

Referring to FIG. 10, the upper mask fin patterns 221 and 222 may include a plurality of first upper mask fin patterns 221, each having a first width W1, and a plurality of second upper mask fin patterns 222, each having a second width W2. According to some embodiments, the first width W1 and the second width W2 may be equal or substantially equal. That is, the first upper mask fin patterns 221 and the second upper mask fin patterns 222 may be formed to have the same width or substantially the same width.

According to some embodiments, a distance between the first upper mask fin patterns 221 may be a first distance S1, and a distance between the second upper mask fin patterns 222 may be a second distance S2. In other words, a distance between two adjacent ones of the first upper mask fin patterns 221 may be the first distance S1, and a distance between two adjacent ones of the second upper mask fin patterns 222 may be the second distance S2.

According to some embodiments, the first distance S1 and the second distance S2 may be equal or substantially equal. That is, the distance between adjacent first upper mask fin patterns 221 and the distance between adjacent second upper mask fin patterns 222 may be equal or substantially equal.

After the formation of the upper mask fin patterns 221 and 222, a third sacrificial layer 610 may be formed on the lower mask layer 210 to at least partially cover the upper mask fin patterns 221 and 222, and a third capping layer 620 may be formed on the third sacrificial layer 610.

The third sacrificial layer 610 may include polycrystalline silicon, an ACL, and/or an SOH.

The third capping layer 620 may include, for example, silicon oxynitride (SiON).

Each of the third sacrificial layer 610 and the third capping layer 620 may be formed by a process, such as ALD, CVD, or spin coating. A bake process or a curing process may be additionally performed based on the material.

A second photosensitive film pattern 710 may be formed on the third capping layer 620.

The second photosensitive film pattern 710 may be formed by forming a photoresist (PR) on the third capping layer 620 and then performing a photolithography process. In FIG. 10, the second photosensitive film pattern 710 is illustrated as a single layer. However, this is merely for purposes of description, and embodiments of the present inventive concept are not limited thereto.

That is, in some embodiments, the second photosensitive film pattern 710 may further include an anti-reflective layer for inhibiting or preventing light from being reflected by an underlying film during a photolithography process. The anti-reflective layer may include, but is not limited to, a BARC or a dBARC.

The second photosensitive film pattern 710 may be formed to have a third width W3. According to some embodiments, the third width W3 may be greater than the first width W1 and/or the second width W2. Accordingly, a lower dummy mask pattern 203 (see FIG. 11) to be formed in a subsequent process may be wider than first lower mask fin patterns 201 (see FIG. 11) and/or second lower mask fin patterns 202 (see FIG. 11).

A lateral or horizontal distance as viewed in cross-section between a first upper mask fin pattern 221 horizontally adjacent to the second photosensitive film pattern 710 and the second photosensitive film pattern 710 may be a third distance S3. In addition, a lateral or horizontal distance as viewed in cross-section between a second upper mask fin pattern 222 adjacent to the second photosensitive film pattern 710 and the second photosensitive film pattern 710 may be a fourth distance S4. Here, the distance between the second photosensitive film pattern 710 and the first upper mask fin pattern 221 or the second upper mask fin pattern 222 denotes a distance between an extension line of the second photosensitive film pattern 710 extending in a direction in which the third sacrificial layer 610 and the third capping layer 620 are stacked, i.e., a vertical direction when the device is viewed in cross-section as shown in FIG. 10, and the first upper mask fin pattern 221 or the second upper mask fin pattern 222.

According to some embodiments, the third distance S3 may be equal or substantially equal to the first distance S1 and/or the second distance S2. In other words, the distance between the first upper mask fin patterns 221, the distance between the second upper mask fin patterns 222, and the distance between the first upper mask fin pattern 221 horizontally adjacent to the second photosensitive film pattern 710 when viewed in cross-section and the second photosensitive film pattern 710 may be equal or substantially equal.

According to some embodiments, the fourth distance S4 may be equal or substantially equal to the first distance S1 and/or the second distance S2. In other words, the distance between the first upper mask fin patterns 221, the distance between the second upper mask fin patterns 222, and the distance between the first and second upper mask fin pattern 221 and 222 adjacent to the second photosensitive film pattern 710 and the second photosensitive film pattern 710 may be equal or substantially.

Figure 11:
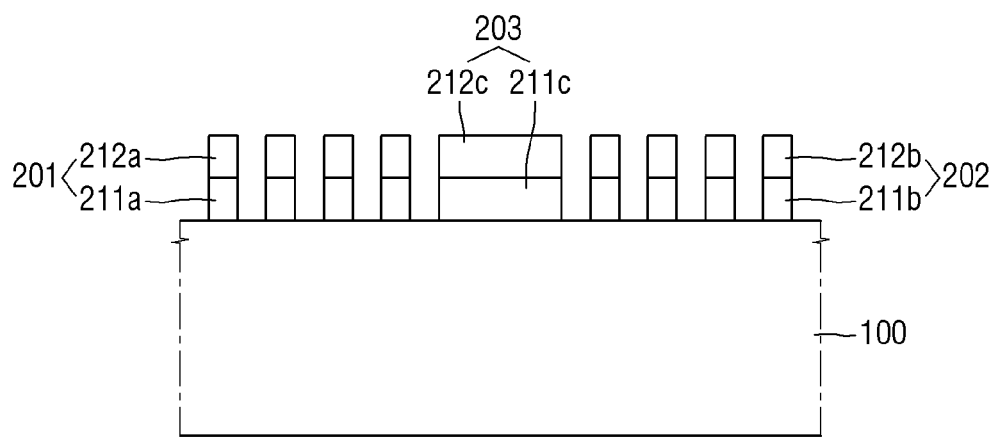

Referring to FIG. 11, the lower mask layer 210 may be patterned using the second photosensitive film pattern 710 and the upper mask fin patterns 221 and 222 as an etch mask.

First, the third capping layer 620 and the third sacrificial layer 610 may be patterned using the second photosensitive film pattern 710 as an etch mask. Here, the third capping layer 620 and the third sacrificial layer 610 may be removed, excluding a portion of the third capping layer 620 and a portion of the third sacrificial layer 610 which correspond to vertical extension lines of the second photosensitive film pattern 710.

Then, lower mask fin patterns 201 through 203 may be formed by patterning the lower mask layer 210 using the portion of the third capping layer 620 (or the portion of the third sacrificial layer 610) and the upper mask fin patterns 221 and 222 as an etch mask. After that, the remaining upper mask fin patterns 221 and 222, the third sacrificial layer 610 and the third capping layer 620 may be removed.

The lower mask fin patterns 201 through 203 formed on the substrate 100 may include first portions 211a through 211c of the first lower mask layer 211 and first portions 212a through 212c of the second lower mask layer 212, respectively.

The lower mask fin patterns 201 through 203 may include the first lower mask fin patterns 201, the second lower mask fin patterns 202, and the lower dummy mask pattern 203. The first lower mask fin patterns 201 may be portions formed using the first upper mask fin patterns 221 as a mask, the second lower mask fin patterns 202 may be portions formed using the second upper mask fin patterns 222 as a mask, and the lower dummy mask pattern 203 may be a portion formed using the second photosensitive film pattern 710 as a mask.

Figure 12:
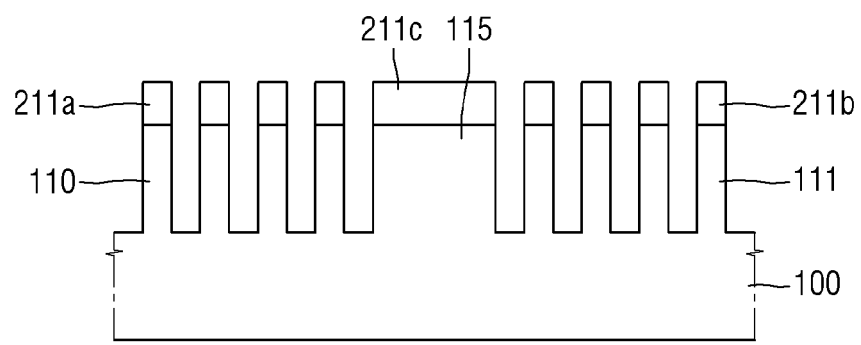
Figure 13:
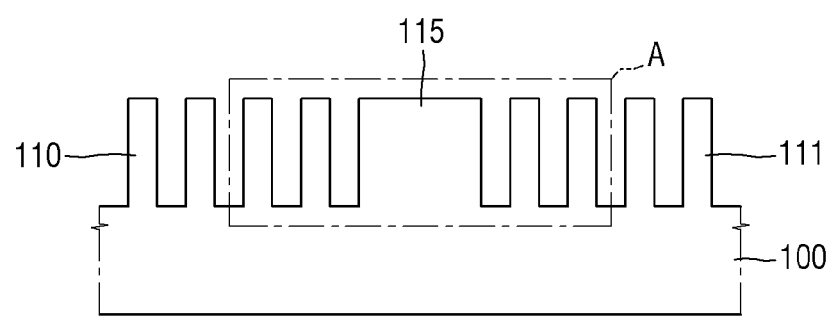

Referring to FIGS. 12 and 13, the substrate 100 may be partially patterned using the lower mask fin patterns 201 through 203 as an etch mask.

The partial etching of the substrate 100 may result in the formation of the fin patterns 110, 111 and 115. Specifically, the first fin patterns 110 may be formed by etching at least a portion of the substrate 100 using the first lower mask fin patterns 201 as an etch mask. In addition, the second fin patterns 111 may be formed by etching at least a portion of the substrate 100 using the second lower mask fin patterns 202 as an etch mask. In addition, a dummy fin pattern 115 may be formed by etching at least a portion of the substrate 100 using the lower dummy mask pattern 203 as an etch mask.

As illustrated in FIG. 12, the first portions 211a through 211c of the first lower mask layer 211 may be left on the fin patterns 110, 111 and 115 in the process of forming the fin patterns 110, 111 and 115. In other embodiments, however, the first portions 211a through 211c of the first lower mask layer 211 and the first portions 212a through 212c of the second lower mask layer 212 may all be removed as illustrated in FIG. 13. According to some embodiments of the inventive concept, the first portions 211a through 211c of the first lower mask layer 211 and/or the first portions 212a through 212c of the second lower mask layer 212 may be removed in the process of forming a field insulating layer 150 (see FIG. 16) later.

Figure 14:
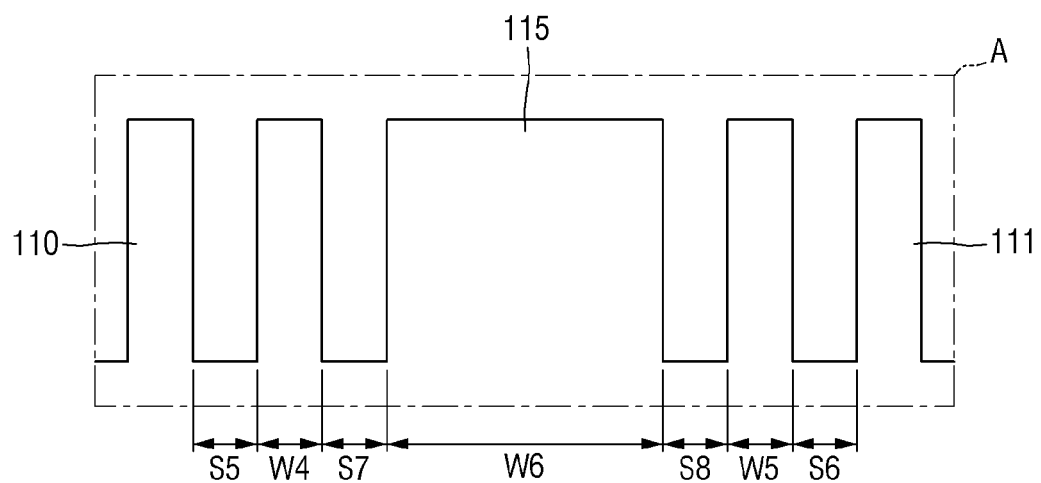
FIG. 14 is an enlarged view of an area A of FIG. 13.

FIG. 14 is an enlarged view of an area A of FIG. 13.

Referring to FIG. 14, in a method of fabricating a semiconductor device according to some embodiments of the inventive concept, the first fin patterns 110, each having a fourth width W4, the second fin patterns 111, each having a fifth width W5, and the dummy fin pattern 115 having a sixth width W6 may be formed.

According to some embodiments, the fourth width W4 and the fifth width W5 may be equal or substantially equal. That is, the first fin patterns 110 and the second fin patterns 111 may have the same width or substantially the same width.

According to some embodiments, the sixth width W6 may be greater than the fourth width W4 and the fifth width W5. That is, the dummy fin pattern 115 may be wider than the first fin patterns 110 and the second fin patterns 111.

A distance between the first fin patterns 110 may be a fifth distance S5, and a distance between the second fin patterns 111 may be a sixth distance S6. According to some embodiments, the fourth distance S4 and the sixth distance S6 may be equal or substantially equal. That is, the distance between adjacent first fin patterns 110 may be equal or substantially equal to the distance between adjacent second fin patterns 111.

A distance between a first fin pattern 110 (hereinafter, referred to as a first adjacent fin pattern) adjacent to the dummy fin pattern 115 and the dummy fin pattern 115 may be a seventh distance S7, and a distance between a second fin pattern 111 (hereinafter, referred to as a second adjacent fin pattern) adjacent to the dummy fin pattern 115 and the dummy fin pattern 115 may be an eighth distance S8.

According to some embodiments, the fifth through eighth distances S5 through S8 may be equal or substantially equal. That is, the distance S5 between adjacent ones of the first fin patterns 110, the distance S6 between adjacent ones of the second fin patterns 111, the distance S7 between the dummy fin pattern 115 and the first adjacent fin pattern, and the distance S8 between the dummy fin pattern 115 and the second adjacent fin pattern may be equal or substantially equal.

As described above with reference to FIG. 10, the distance S1 between adjacent ones of the first upper mask fin patterns 221, the distance S2 between adjacent ones of the second upper mask fin patterns 222, the distance S3 between the second photosensitive film pattern 710 and a first upper mask fin pattern 221 adjacent to the second photosensitive film pattern 710, and the distance S4 between the second photosensitive film pattern 710 and a second upper mask fin pattern 222 adjacent to the second photosensitive film pattern 710 may be equal or substantially equal.

Accordingly, a distance S5 between the first lower mask fin patterns 201, a distance S6 between the second lower mask fin patterns 202, a distance S7 between the lower dummy mask pattern 203 and a first lower mask fin pattern 201 adjacent to the lower dummy mask pattern 203, and a distance S8 between the lower dummy mask pattern 203 and a second lower mask fin pattern 202 adjacent to the lower dummy mask pattern 203 may be equal or substantially equal.

Because the first fin patterns 110, the second fin patterns 111 and the dummy fin pattern 115 are formed using the first lower mask fin patterns 201, the second lower mask fin patterns 202, and the lower dummy mask pattern 203 as masks, respectively, the fifth through eighth distances S5 through S8 may be equal or substantially equal.

Recently, as semiconductor devices have become more highly integrated, a gap between an active region where a source/drain contact is formed and a gate contact is reduced, thus increasing the possibility of an electrical short circuit between an element disposed in the active region and the gate contact. To address this problem, a method of increasing the area of a region where the gate contact is formed has been proposed. However, this method increases the area of the entire cell. In addition, a method of reducing the number of fins formed in the active region has been proposed. In this case, however, the performance of the semiconductor may be degraded.

If the dummy fin pattern 115 is formed using a dummy mask pattern according to some embodiments of the inventive concept, it may be possible to prevent or reduce the likelihood of a short circuit between an element in an active region and a gate contact, minimize or limit an increase in cell area, and maintain performance. Specifically, in a conventional method, a fin pattern having the same width as a fin formed in an active region is formed and then removed to define a region (e.g., a shallow trench isolation (STI) region) where a gate contact is formed. Therefore, an STI region having a width of n times (where n is a natural number) the fin pitch can be formed. In contrast, in methods of fabricating a semiconductor device according to some embodiments of the inventive concept, a dummy fin is formed through a separate process, and an STI region is defined using the dummy fin. Therefore, an STI region having various widths instead of a width of n times the fin pitch can be formed. Accordingly, it may be possible to prevent or reduce the likelihood of an electrical short circuit between a gate contact and another element and minimize or limit an increase in cell area.

In addition, in a conventional method, a loading effect due to a difference in distance between fin mask patterns, that is, non-uniformity between etching speed and etching profile may occur during formation of an STI region. This may create over-etched portions, which may cause defects in the characteristics of a semiconductor device. In contrast, in methods of fabricating a semiconductor device according to some embodiments of the inventive concept, the distance between the dummy pattern 115 and an adjacent fin pattern 110 or 111 is made equal or substantially equal to the distance between adjacent fin patterns 110 or 111. Therefore, it may be possible to prevent or reduce the effects of the loading effect, thus reducing a defect rate of a semiconductor.

Figure 15:
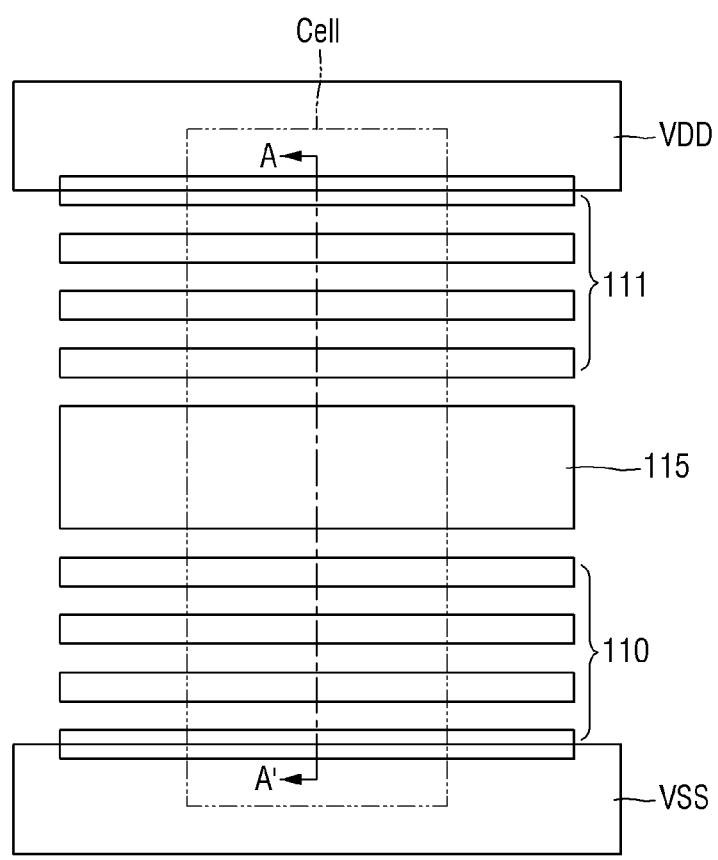
FIG. 15 is a layout view of a semiconductor device according to some embodiments of the inventive concept.

FIG. 15 is a layout view of a semiconductor device according to some embodiments of the inventive concept.

When a complementary metal oxide semiconductor (CMOS) integrated circuit is designed and manufactured, a standard cell having a recognized cell height may be configured, and the area and performance of the standard cell may be optimized for the purpose of area efficiency and smooth routing.

Referring to FIG. 15, methods of fabricating a semiconductor device according to some embodiments of the inventive concept can be applied to a standard cell. That is, methods of fabricating a semiconductor device according to some embodiments of the inventive concept can be applied when fin patterns constituting a standard cell are fabricated. That is, FIG. 13 may be a cross-sectional view of a cell of FIG. 15, taken along A-A'. The cell may include two power supply lines VDD and VSS, but the power supply lines VDD and VSS are not illustrated in FIGS. 1 through 14 for brevity of description. The method according to some embodiments of the inventive concept can be applied not only to a standard cell, but also to all kinds of semiconductor devices to which fin patterns are applied.

Figure 16:
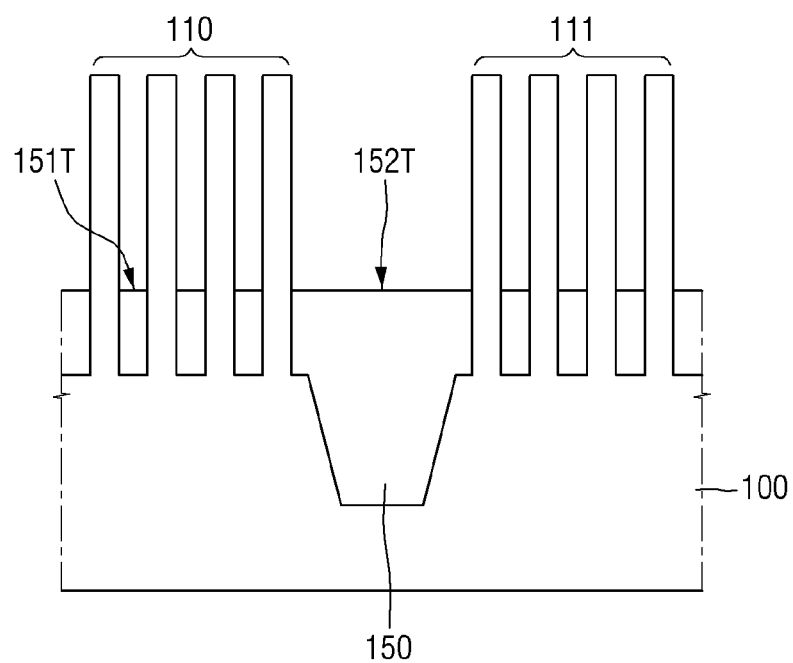
FIG. 16 is a view illustrating a method of fabricating a semiconductor device according to further embodiments of the inventive concept.
Figure 17:
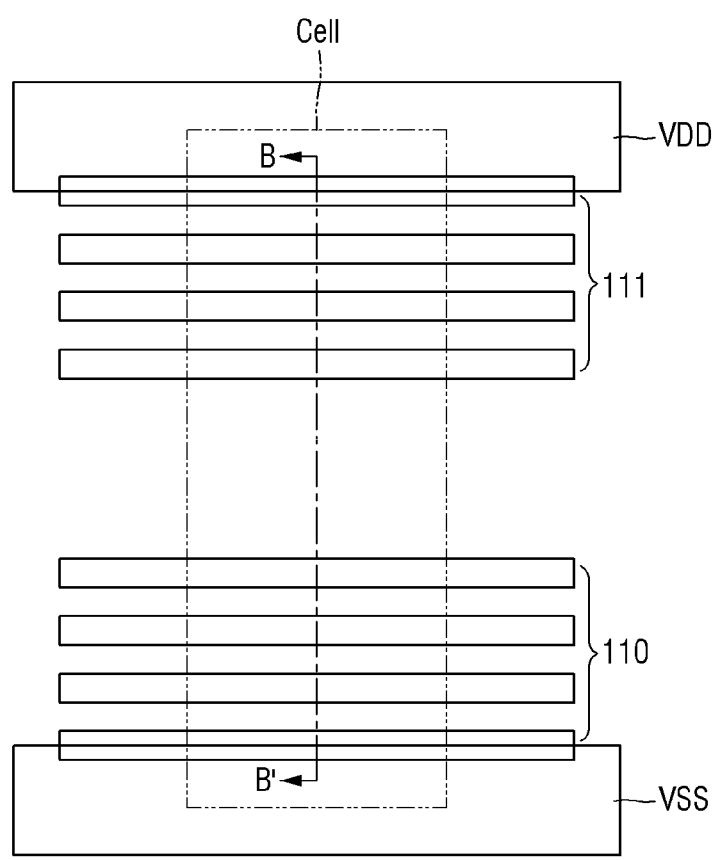
FIG. 17 is a layout view of a semiconductor device according to further embodiments of the inventive concept.

FIG. 16 is a view illustrating a method of fabricating a semiconductor device according to further embodiments of the inventive concept. FIG. 17 is a layout view of a semiconductor device according to further embodiments of the inventive concept.

Referring to FIGS. 16 and 17, a field insulating layer 150 may be formed, such that upper portions of first fin patterns 110 and second fin patterns 111 protrude from the field insulating layer 150. FIG. 16 may be a cross-sectional view of a cell of FIG. 17, taken along B-B'. The cell may include two power supply lines VDD and VSS, but the power supply lines VDD and VSS are not illustrated in FIG. 16 for brevity of description.

According to some embodiments, an insulating layer may be formed to at least partially fill shallow trenches 151T between the first fin patterns 110 and the second fin patterns 111 by etching a substrate 100.

A deep trench 152T may be additionally formed, and then an insulating layer may be formed to at least partially fill the deep trench 152T. According to some embodiments, a dummy fin pattern 115 may be removed in the process of forming the deep trench 152T.

That is, a method of fabricating a semiconductor device according to some embodiments of the inventive concept may further include forming the field insulating layer 150, such that the upper portions of the first fin patterns 110 and the second fin patterns 111 protrude.

The forming of the field insulating layer 150 may include forming an insulating layer, which at least partially fills the shallow trenches 151T between the first fin patterns 110 and the second fin patterns 111, forming the deep trench 151T by removing the dummy fin pattern 115, and forming an insulating layer, which fills the deep trench 152T.

The forming of the deep trench 152T may include forming a photosensitive film pattern on the insulating layer and forming the deep trench 152T by etching the insulating layer and a portion of the substrate 110 using the photosensitive film pattern.

According to some embodiments, after the deep trench 152T is formed, an insulating layer may be formed to at least partially fill the shallow trenches 151T and the deep trench 152T.

That is, the forming of the field insulating layer 150 may include forming the deep trench 152T by removing the dummy fin pattern 115 and forming an insulating layer to at least partially fill the shallow trenches 151T between the first fin patterns 110 and the second fin patterns 111 and the deep trench 152T.

The forming of the deep trench 152T may include forming an insulating layer on the substrate 100 to cover mask patterns 110, 111 and 115, forming a photosensitive film pattern on the insulating layer, and forming the deep trench 152T by etching the insulating layer and a portion of the substrate 100 using the photosensitive film pattern.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A method of fabricating a semiconductor device, comprising:
    forming a lower mask layer, an upper mask layer, a first sacrificial layer and a second sacrificial layer, which are sequentially stacked, on a substrate;
    forming a first photosensitive film pattern on the second sacrificial layer;
    forming a first mandrel by etching the second sacrificial layer using the first photosensitive film pattern;
    forming first spacers on sidewalls of the first mandrel;
    forming a second mandrel by etching the first sacrificial layer using the first spacers;
    forming second spacers on sidewalls of the second mandrel;
    forming a first upper mask fin pattern and a second upper mask fin pattern, which are spaced apart from each other, by etching the upper mask layer using the second spacers;
    forming a third sacrificial layer on the first upper mask fin pattern and the second upper mask fin pattern and on the lower mask layer;
    forming a second photosensitive film pattern on the third sacrificial layer between the first upper mask fin pattern and the second upper mask fin pattern;
    forming lower mask fin patterns on the substrate by etching the lower mask layer using the second photosensitive film pattern, the first upper mask fin pattern, and the second upper mask fin pattern; and
    forming fin patterns by etching the substrate using the lower mask fin patterns,
    wherein the forming of the lower mask fin patterns comprises:
    forming a lower dummy mask pattern by etching the third sacrificial layer and the lower mask layer using the second photosensitive film pattern;
    forming a first lower mask fin pattern by etching the lower mask layer using the first upper mask fin pattern; and
    forming a second lower mask fin pattern by etching the lower mask layer using the second upper mask fin pattern,
    wherein the forming fin patterns comprises:
    forming a dummy fin pattern by etching at least a first portion of the substrate using the lower dummy mask pattern,
    forming a first fin pattern by etching at least a second portion of the substrate using the first lower mask fin patterns, and
    forming a second fin pattern by etching at least a third portion of the substrate using the second lower mask fin patterns.

2. The method of claim 1, further comprising removing the dummy fin pattern.

3. The method of claim 1, further comprising forming a field insulating layer, such that upper portions of the plurality of first fin patterns and the plurality of second fin patterns protrude from the field insulating layer.

4. The method of claim 3, wherein the forming the field insulating layer comprises:
    forming a first insulating layer to fill a shallow trench between the first fin patterns and the second fin patterns
    forming a deep trench by removing the dummy fin pattern, and
    forming a second insulating layer to fill the deep trench.

5. The method of claim 4, wherein the forming of the lower mask fin patterns comprises forming the lower mask fin patterns, such that a first distance between respective ones of the plurality of first lower mask fin patterns and a second distance between respective ones of the plurality of second lower mask fin patterns are equal.

6. The method of claim 5, wherein the forming of the lower mask fin patterns comprises forming the lower mask fin patterns, such that a first distance between respective ones of the plurality of first lower mask fin patterns and a second distance between respective ones of the plurality of second lower mask fin patterns are equal.

7. A method of fabricating a semiconductor device, comprising:
    forming mask patterns on a substrate, the mask patterns comprising a plurality of first mask fin patterns, a plurality of second mask fin patterns and a dummy mask pattern between the plurality of first mask fin patterns and the plurality of second mask fin patterns, such that a distance between respective ones of the plurality of first mask fin patterns is a first distance and a distance between respective ones of the plurality of second mask fin patterns is a second distance, the first distance being equal to the second distance;
    forming a first fin pattern, a second fin pattern, and a dummy fin pattern by etching the substrate using the plurality of first mask fin patterns, the plurality of second mask fin patterns, and the dummy mask fin pattern, respectively, the dummy fin pattern comprising a single dummy fin extending from the substrate in a first direction and having a first width in a second direction that is perpendicular to the first direction;

removing the dummy fin pattern;

forming a deep trench by removing the dummy fin pattern; and forming a field insulating layer that contacts a bottom surface of the deep trench, wherein forming the first fin pattern and the second fin pattern comprises forming a plurality of first fin patterns and a plurality of second fin patterns immediately adjacent opposing sides of the deep trench, respectively, respective ones of the plurality of first fin patterns have a third distance therebetween and respective ones of the plurality of second fin patterns having a fourth distance therebetween, the third distance being equal to the fourth distance, wherein each of the plurality of first fin patterns and plurality of second fin patterns has a second width in the second direction, the first width being greater than the second width, and wherein the bottom surface of the deep trench is disposed in a position lower than a bottom surface of a shallow trench between respective ones of the plurality of first patterns and between respective ones of the plurality of second fin patterns.

8. The method of claim 7, wherein the forming of the first fin pattern, the second fin pattern and the dummy fin pattern comprises:

etching a mask layer on the substrate and the substrate using the mask patterns; and removing the mask layer.

9. The method of claim 7, wherein the forming of the mask patterns comprises forming the mask patterns such that the first distance, the second distance, a fifth distance between one of the plurality of first mask fin patterns adjacent to the dummy mask pattern and the dummy mask pattern, and a sixth distance between one of the plurality of second mask fin patterns adjacent to the dummy mask pattern and the dummy mask pattern are equal.

10. The method of claim 7, wherein upper portions of the plurality of first fin patterns and the plurality of second fin patterns protrude from the field insulating layer.

11. The method of claim 10, wherein the field insulating layer comprises a first insulating layer, and wherein the forming of the field insulating layer comprises:

forming a second insulating layer in shallow trenches between the plurality of first fin patterns and the plurality of second fin patterns;

forming the deep trench by removing the dummy fin pattern; and forming the first insulating layer that contacts a bottom surface of the deep trench.

12. The method of claim 11, wherein the forming of the deep trench comprises:

forming a first photosensitive film pattern on the second insulating layer; and forming the deep trench by etching the second insulating layer and a portion of the substrate using the first photosensitive film pattern.

13. The method of claim 10, wherein the field insulating layer is a first insulating layer, and wherein the forming of the field insulating layer comprises:

forming the deep trench by removing the dummy fin pattern; and forming a second insulating layer in shallow trenches between the plurality of first fin patterns and the plurality of second fin patterns, and the deep trench.

14. The method of claim 13, wherein the forming of the deep trench comprises:

forming a third insulating layer on the plurality of first mask fin patterns, the plurality of second mask fin patterns, the dummy mask pattern, and on the substrate;

forming a second photosensitive film pattern on the third insulating layer; and forming the deep trench by etching the third insulating layer and a portion of the substrate using the second photosensitive film pattern.

* * * * *